(12) United States Patent
Smith et al.

(10) Patent No.: US 8,347,479 B2
(45) Date of Patent: Jan. 8, 2013

(54) METHOD FOR REPAIRING CRACKS IN STRUCTURES

(75) Inventors: Stephen W. Smith, Williamsburg, VA (US); John A. Newman, Yorktown, VA (US); Robert S. Piascik, Williamsburg, VA (US); Edward H. Glaessgen, Yorktown, VA (US)

(73) Assignee: The United States of America as represented by the United States National Aeronautics and Space Administration, Washington, DC (US)

( * ) Notice: Subject to any disclaimer, the term of this patent is extended or adjusted under 35 U.S.C. 154(b) by 269 days.

(21) Appl. No.: 12/849,906

(22) Filed: Aug. 4, 2010

(65) Prior Publication Data

US 2011/0033728 A1  Feb. 10, 2011

Related U.S. Application Data

(60) Provisional application No. 61/231,056, filed on Aug. 4, 2009.

(51) Int. Cl.
*B23P 6/00* (2006.01)

(52) U.S. Cl. ............... 29/402.01; 29/402.09; 29/402.18; 29/407.01; 29/407.05; 29/458; 29/527.1; 29/527.2; 427/142

(58) Field of Classification Search ............... 29/402.01, 29/402.09, 402.18, 407.01, 407.05, 458, 29/527.1, 527.2, 530; 427/142
See application file for complete search history.

(56) References Cited

U.S. PATENT DOCUMENTS

| | | | | |
|---|---|---|---|---|
| 5,915,743 A * | 6/1999 | Palma | ......................... | 29/402.18 |
| 6,274,193 B1 * | 8/2001 | Rigney et al. | ................. | 427/142 |
| 6,322,730 B1 * | 11/2001 | Wachtler | .................... | 264/36.22 |
| 6,454,885 B1 * | 9/2002 | Chesnes et al. | ............... | 148/528 |
| 7,066,375 B2 * | 6/2006 | Bolser | ........................... | 228/114 |
| 8,091,227 B2 * | 1/2012 | Hong | ............................ | 29/889.1 |
| 2004/0050913 A1 * | 3/2004 | Philip | ............................ | 228/194 |
| 2007/0231156 A1 * | 10/2007 | Hong | ......................... | 416/241 R |
| 2009/0255981 A1 * | 10/2009 | Singer et al. | .................. | 228/119 |
| 2009/0280023 A1 * | 11/2009 | Hu | ................................ | 420/445 |
| 2009/0283572 A1 * | 11/2009 | Volek | ............................ | 228/119 |
| 2010/0297345 A1 * | 11/2010 | Jensen et al. | ................... | 427/142 |

FOREIGN PATENT DOCUMENTS

| JP | 63230809 A | * | 9/1988 |
|---|---|---|---|
| JP | 11043706 A | * | 2/1999 |
| JP | 2003056359 A | * | 2/2003 |

* cited by examiner

*Primary Examiner* — Jermie Cozart
(74) *Attorney, Agent, or Firm* — Robin W. Edwards

(57) ABSTRACT

A first material with a known maximum temperature of operation is coated with a second material on at least one surface of the first material. The coating has a melting temperature that is greater than the maximum temperature of operation of the first material. The coating is heated to its melting temperature until the coating flows into any cracks in the first material's surface.

27 Claims, 1 Drawing Sheet

METHOD FOR REPAIRING CRACKS IN STRUCTURES

Pursuant to 35 U.S.C. §119, the benefit of priority from provisional application 61/231,056, with a filing date of Aug. 4, 2009 and which is hereby incorporated by reference in its entirety, is claimed for this non-provisional application.

ORIGIN OF THE INVENTION

This invention was made by employees of the United States Government and may be manufactured and used by or for the Government of the United States of America for governmental purposes without the payment of any royalties thereon or therefor.

BACKGROUND OF THE INVENTION

1. Field of the Invention

This invention relates to structural repair methods. More specifically, the invention is a method and system for repairing cracks found in structures.

2. Description of the Related Art

The root cause of metallic-structural fatigue failure is the initiation and propagation of cracks. Typically, cracks start at local regions of high stress (e.g., bolt holes, corners, etc.) or at microscopic defects inherent in the material (e.g., voids, particles, etc.). To assure that structures (e.g., buildings, bridges, airplanes, aerospace vehicles, etc.) remain operationally safe, routine crack inspection and crack repair programs are utilized. These programs typically consist of the following steps:

determining a safe level of crack damage based on fracture mechanics concepts;

inspecting a structure to insure that the damage state is acceptable; and repairing the structure before the crack damage exceeds safe levels.

Current research in this field has focused on refining the criteria that defines safe crack levels and improving damage monitoring methods/systems (i.e., a field that has come to be known as "structural health monitoring"). However, when it comes to repairing cracks in structures, the approaches vary widely and are generally industry specific, thereby leading to varying degrees of confidence in crack repairs.

SUMMARY OF THE INVENTION

Accordingly, it is an object of the present invention to provide a method and system for repairing cracks in structural materials.

Another object of the present invention is to provide a method of repairing cracks in metallic structures.

Still another object of the present invention is to provide a method of repairing cracks in metallic structures that can be readily applied to a wide variety of existing structures and those being fabricated.

Other objects and advantages of the present invention will become more obvious hereinafter in the specification and drawings.

In accordance with the present invention, a crack repairable system and method of repairing cracks is provided. A first material with a known maximum temperature of operation is coated with a second material on at least one surface of the first material. The coating has a melting temperature that is greater than the maximum temperature of operation of the first material. The second material/coating is heated to its melting temperature until the coating flows into any cracks that might be present in the first material's surface.

DETAILED DESCRIPTION OF THE INVENTION

Figure 1:
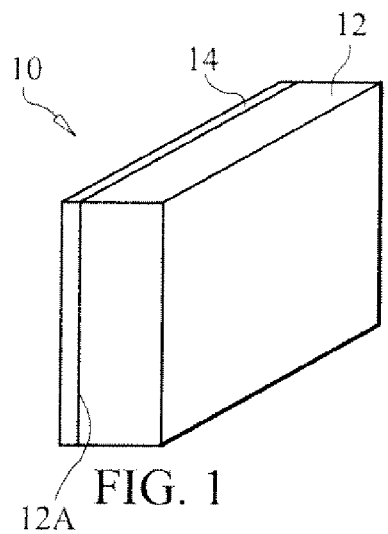
FIG. 1 is a perspective view of a portion of a metallic material/structure coated on one side thereof to form a crack repairable system in accordance with an embodiment of the present invention.

Referring now to the drawings and more particularly to FIG. 1, a crack repairable material system that is or will be part of a structure is referenced by numeral 10. It is to be understood that the material system 10 is representative of either a system that is to be fabricated into a structural element, a portion of a structural element that is to become part of a fabricated structure, or a new or existing part of a fabricated structure, without departing from the scope of the present invention.

Material system 10 includes a base material 12 that defines the structural part of material system 10 selected/designed for a particular application. For example, in aerospace applications, base material 12 is generally selected to be an aerospace structural alloy such as a titanium alloy (e.g., Ti-6Al-4V, Ti21S, etc.) or an aluminum alloy (e.g., AA 2024, AA 7075, etc.). Base material 12 could also be a metallic component, a metallic face sheet, or even a fiber metal laminate.

A surface 12A of a base material 12 is coated with one or more layers of a crack repair coating 14. The number of layers, choice of material for coating 14, and method of applying same to surface 12A can be selected to suit a particular application. Again, in the aerospace application example where base material 12 is a titanium or aluminum alloy, coating 14 can be a low melting temperature eutectic alloy as will be explained further below. The one or more layers of coating 14 could be applied using various coating methodologies such as vapor deposition, sputtering, evaporation, etc.

The selection of crack repair coating 14 is predicated on the operating temperature of base material 12 and the aging criteria temperature of base material 12. As used herein, the "aging criteria temperature" of a material/structure can be defined simply as the temperature at which a material's or structure's properties are affected to the point that their function is degraded. However, it is to be understood that a material's aging criteria temperature can also have a time component associated therewith. That is, a material's aging criteria temperature can be affected (e.g., lowered) by the duration of heat exposure and/or the number of occurrences of heat exposure at a temperature that will cause material properties/function to degrade. Note that in accordance with good design practices, the maximum operating temperature of base material 12 will generally be less than the temperature defined by the aging criteria temperature of base material 12.

In accordance with the present invention, coating 14 must be able to withstand (i.e., not breakdown, melt, etc.) the maximum operating temperature that base material 12 is expected to encounter during its useful service life in an application. As the same time, coating 14 must be able to melt and flow at a temperature that is greater than the above-noted maximum operating temperature of base material 12. For many applications, the melt/flow temperature of coating 14 will also be less than the aging criteria temperature of base material 12, although it may be possible to exceed the aging criteria temperature for brief periods of time without damaging base material 12. For a base material 12 made from the above-mentioned titanium and aluminum alloys, coating 14 can be made from a low melting temperature eutectic alloy such as indium and tin, the formulation of which can be adjusted to satisfy the above-described temperature criteria for a particular application.

Figure 2:
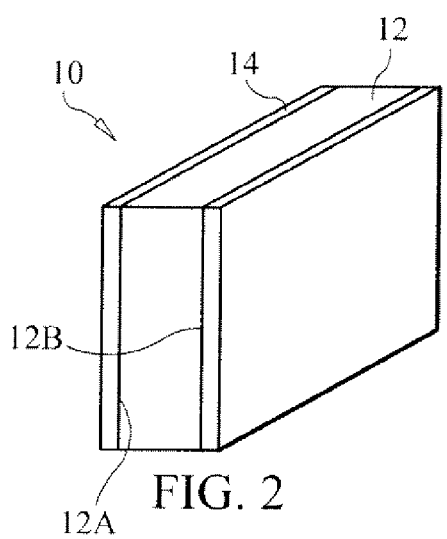
FIG. 2 is a perspective view of a portion of a metallic material/structure coated on opposing sides thereof to form a crack repairable system in accordance with another embodiment of the present invention.

The present invention is not limited to the coating of a single surface of the base material. Accordingly, FIG. 2 illustrates base material 12 with crack repair coating 14 on opposing surfaces 12A, 12B of base material 12. In general, any surface of base material 12 could be coated with crack repair coating 14. Further, the number of layers, thickness, and even formulations of coating 14 could be varied across base material 12 without departing from the scope of the present invention.

Figure 3:
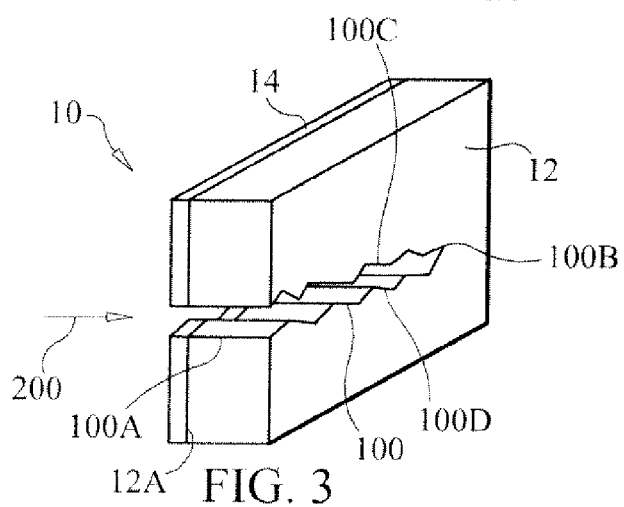
FIG. 3 is a perspective view of the metallic material/structure from FIG. 1 with a crack formed therein.
Figure 4:
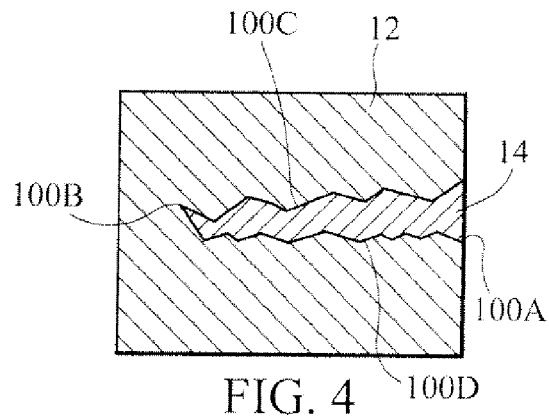
FIG. 4 is a cross-sectional view of the metallic material/structure illustrating a complete filling of the crack after repairing in accordance with the present invention.
Figure 5:
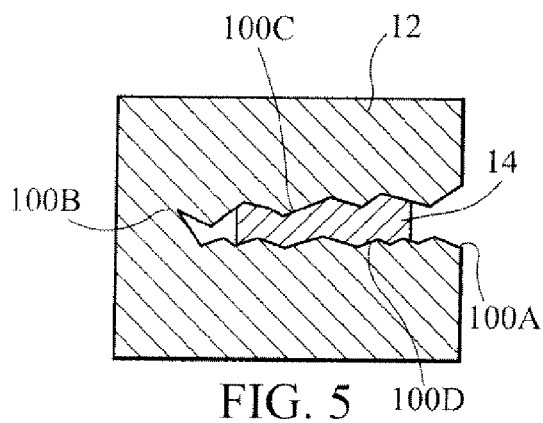
FIG. 5 is a cross-sectional view of the metallic material/structure illustrating a partial filling of the crack after repairing in accordance with the present invention.

Referring now to FIGS. 3-5, crack repair in accordance with the present invention will be explained. By way of example, material system 10 (FIG. 1) is illustrated with a crack 100 formed therein. In most instances, crack 100 will extend through coating 14. The mouth of crack 100 is indicated at 100A and its tip is indicated at 100B. Opposing faces of crack 100 are indicated at 100O and 100D.

Prior to the repair of crack 100 in accordance with the present invention, material system 10 will generally be subjected to an inspection in order to detect crack 100. Accordingly, the crack repair methodology of the present invention can include inspection (e.g., periodically) of material system 10. The particular choice of inspection system/method is not a limitation of the present invention. Furthermore, it is to be understood that an inspection process is not a requirement of the present invention. That is, the crack repair process of the present invention could be implemented automatically, periodically, etc., without ever inspecting for cracks.

Once crack 100 detected (or at some predetermined time if no inspection process is employed), the repair of crack 100 is initiated through the application of heat referenced by arrow 200. More specifically, heat 200 must be sufficient to raise coating 14 to its melting temperature so that it can begin to flow. However, heat 200 should not raise the temperature of base material 12 above its aging criteria temperature for any amounts of time that might lead to degradation of base material 12. Heat 200 can be applied "globally" across all of material system 10, but it may be more practical to apply heat 200 "locally" in the proximity of crack 100.

As coating 14 melts and flows, it will completely or at least partially fill crack 100 as illustrated respectively in FIGS. 4 and 5. Ideally, coating 14 completely fills crack 10 from its mouth 100A to its tip 100B as shown in FIG. 4. However, depending on the size of crack 100 and the viscosity of coating 14 when melted, crack 100 may only be partially filled as shown in FIG. 5. In either case, with crack 100 so filled, heat 200 is removed and coating 14 is allowed to cool and harden. As this is occurring, coating 14 adheres to opposing faces 100C and 100D thereby bridging across crack 100. By filling crack 100, load transfer across material system 10 occurs through coating 14 and the force experienced by crack 100 is reduced. Furthermore, when the structure embodying material system 10 is unloaded such that crack 100 experiences decreasing loads, coating 14 acts to close opposing crack surfaces 100O and 100D to thereby eliminate the stress at crack tip 100B.

Note that even if the crack bridging mechanism fails (i.e., coating 14 no longer adheres to opposing crack faces 100C and 100D) after a period of time, the crack closure mechanism will remain.

The advantages of the present invention are numerous. A material/structure is made crack repairable by a coating that can be heated to its melt/flow temperature without adversely affecting the behavior of the underlying structure. The process of heating the coating in proximity to any cracks can be repeated periodically as part of a structure's regular maintenance program. The process/system can be implemented on existing completed structures and during a structure's assembly/fabrication. The heat needed for repairs could be applied by an external source or one built into a structure. The process/system will be particularly useful as part of an overall health monitoring system for airplanes and aerospace vehicles.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A method of repairing cracks in materials, comprising the steps of:
    providing a first material with a known maximum temperature of operation;
    coating at least one surface of said first material with a second material having a melting temperature that is greater than said first material's maximum temperature of operation; and
    heating said second material to said melting temperature thereof and until said second material flows, wherein cracks in said at least one surface are at least partially filled with said second material.

2. A method according to claim 1, further comprising the step of inspecting said first material for cracks.

3. A method according to claim 2, further comprising the steps of repeatedly performing said steps of inspecting and heating.

4. A method according to claim 2, wherein said step of inspecting is performed periodically.

5. A method according to claim 1, further comprising the step of repeatedly performing said step of heating.

6. A method according to claim 1, wherein said step of coating comprises the step of generating layers of said second material on said at least one surface of said first material.

7. A method according to claim 1, wherein said step of coating is selected from the group consisting of vapor deposition coating, sputter coating, and evaporation coating.

8. A method according to claim 1, wherein said first material is a metallic material.

9. A method according to claim 1, wherein said second material is a metallic material.

10. A method according to claim 1, wherein said first material is part of a structure, and wherein said step of coating occurs during fabrication of the structure.

11. A method according to claim 10, wherein said second material comprises an alloy of indium and tin.

12. A method according to claim 1, wherein said first material is part of a structure, and wherein said step of coating occurs after fabrication of the structure.

13. A method according to claim 1, wherein said first material is selected from the group consisting of titanium alloys and aluminum alloys.

14. A method of repairing cracks in materials, comprising the steps of:
   providing a first metallic material with a known maximum temperature of operation and a known aging criteria temperature;
   coating at least one surface of said first metallic material with a second metallic material having a melting temperature between said first metallic material's maximum temperature of operation and said first metallic material's aging criteria temperature;
   inspecting said first metallic material for cracks in said at least one surface; and
   heating said second metallic material in proximity to at least one of the cracks detected during said step of inspecting, said second metallic material being heated to said melting temperature thereof and until said second metallic material flows into the at least one of the cracks.

15. A method according to claim 14, further comprising the steps of repeatedly performing said steps of inspecting and heating.

16. A method according to claim 14, wherein said step of inspecting is performed periodically.

17. A method according to claim 14, wherein said step of coating includes the step of generating layers of said second metallic material on said at least one surface of said first metallic material.

18. A method according to claim 14, wherein said step of coating is selected from the group consisting of vapor deposition coating, sputter coating, and evaporation coating.

19. A method according to claim 14, wherein said first metallic material is part of a structure, and wherein said step of coating occurs during fabrication of the structure.

20. A method according to claim 14, wherein said first metallic material is part of a structure, and wherein said step of coating occurs after fabrication of the structure.

21. A method according to claim 14, wherein said first metallic material is selected from the group consisting of titanium alloys and aluminum alloys.

22. A method according to claim 21, wherein said second metallic material comprises an alloy of indium and tin.

23. A method of repairing cracks in structures, comprising the steps of:
   providing a metallic structure with a known maximum temperature of operation and a known aging criteria temperature;
   providing a metallic coating on at least one surface of said metallic structure, wherein said metallic coating has a melting temperature between said maximum temperature of operation and said aging criteria temperature of said metallic structure;
   inspecting said metallic structure for cracks in said at least one surface thereof; and
   heating said metallic coating in proximity to at least one of the cracks detected during said step of inspecting, said metallic coating being heated to said melting temperature thereof and until said metallic coating flows into the at least one of the cracks.

24. A method according to claim 23, further comprising the steps of repeatedly performing said steps of inspecting and heating.

25. A method according to claim 23, wherein said step of inspecting is performed periodically.

26. A method according to claim 23, wherein said at least one surface of said metallic structure is selected from the group consisting of titanium alloys and aluminum alloys.

27. A method according to claim 26, wherein said metallic coating comprises an alloy of indium and, tin.

* * * * *